(12) United States Patent
Dulle

(10) Patent No.: US 11,112,463 B2
(45) Date of Patent: Sep. 7, 2021

(54) INTEGRATED BATTERY SENSOR FOR MULTIPLE BATTERY MODULES

(71) Applicant: CPS TECHNOLOGY HOLDINGS LLC, New York, NY (US)

(72) Inventor: Ronald J. Dulle, Mequon, WI (US)

(73) Assignee: CPS TECHNOLOGY HOLDINGS LLC, New York, NY (US)

( * ) Notice: Subject to any disclaimer, the term of this patent is extended or adjusted under 35 U.S.C. 154(b) by 111 days.

(21) Appl. No.: 14/677,529

(22) Filed: Apr. 2, 2015

(65) Prior Publication Data

US 2015/0293180 A1 Oct. 15, 2015

Related U.S. Application Data

(60) Provisional application No. 61/978,510, filed on Apr. 11, 2014.

(51) Int. Cl.
*G01R 31/36* (2020.01)
*G01R 31/396* (2019.01)
(Continued)

(52) U.S. Cl.
CPC ............ *G01R 31/396* (2019.01); *B60L 58/19* (2019.02); *B60L 58/20* (2019.02); *G01R 31/378* (2019.01); *G01R 31/388* (2019.01); *G01R 31/3835* (2019.01); *G01R 31/3842* (2019.01); *H01M 10/052* (2013.01); *H01M 10/06* (2013.01); *H01M 10/48* (2013.01);
(Continued)

(58) Field of Classification Search
CPC .............. G01R 31/3658; G01R 31/362; G01R 31/3637; G01R 31/3675; G01R 31/3679; G01R 31/36

USPC .......................................................... 324/431
See application file for complete search history.

(56) References Cited

U.S. PATENT DOCUMENTS

| 5,183,712 A * | 2/1993 | Beldock ............... H01M 2/105 429/100 |
| 5,710,506 A * | 1/1998 | Broell ................. H02J 7/00711 320/145 |

(Continued)

FOREIGN PATENT DOCUMENTS

| CN | 101160688 A | 4/2008 |
| CN | 102834287 A | 12/2012 |

(Continued)

OTHER PUBLICATIONS

PCT/US2015/024985; International Search Report and the Written Opinion, dated Jun. 18, 2015, 12 pages.
CN201580003103.6 Office Action dated Apr. 28, 2018.

*Primary Examiner* — Richard Isla
*Assistant Examiner* — Dung V Bui
(74) *Attorney, Agent, or Firm* — Christopher & Weisberg, P.A.

(57) ABSTRACT

The present disclosure includes a method that includes receiving, via a processor disposed within a lithium ion battery module, a voltage signal associated with a resistor coupled to a negative terminal of the lithium ion battery module. The negative terminal of the lithium ion battery module is coupled to a negative terminal of a lead acid battery module. The method also includes determining, via the processor, one or more properties associated with the lead acid battery module based on the voltage signal.

19 Claims, 4 Drawing Sheets

(51) Int. Cl.

| | | |
|---|---|---|
| *G01R 31/388* | (2019.01) | |
| *G01R 31/3835* | (2019.01) | |
| *H01M 10/052* | (2010.01) | |
| *H01M 10/06* | (2006.01) | |
| *H01M 10/48* | (2006.01) | |
| *H01M 16/00* | (2006.01) | |
| *H02J 7/00* | (2006.01) | |
| *G01R 31/378* | (2019.01) | |
| *G01R 31/3842* | (2019.01) | |
| *B60L 58/19* | (2019.01) | |
| *B60L 58/20* | (2019.01) | |
| *G01R 31/364* | (2019.01) | |
| *G01R 31/374* | (2019.01) | |
| *G01R 31/392* | (2019.01) | |
| *H01M 10/42* | (2006.01) | |
| *G01R 31/379* | (2019.01) | |

(52) U.S. Cl.
CPC ....... *H01M 10/482* (2013.01); *H01M 10/486* (2013.01); *H01M 16/00* (2013.01); *H02J 7/0016* (2013.01); *B60L 2240/545* (2013.01); *B60L 2240/547* (2013.01); *B60L 2240/549* (2013.01); *G01R 31/364* (2019.01); *G01R 31/374* (2019.01); *G01R 31/379* (2019.01); *G01R 31/392* (2019.01); *H01M 2010/4271* (2013.01); *H01M 2220/20* (2013.01); *Y02E 60/10* (2013.01); *Y02P 70/50* (2015.11); *Y02T 10/70* (2013.01)

(56) References Cited

U.S. PATENT DOCUMENTS

| | | |
|---|---|---|
| 5,767,659 A | 6/1998 | Farley |
| 6,002,240 A | 12/1999 | McMahan et al. |
| 6,074,775 A | 6/2000 | Gartstein et al. |
| 6,410,185 B1 * | 6/2002 | Takahashi ........... H01M 10/643 429/163 |
| 7,319,304 B2 | 1/2008 | Veloo et al. |
| 8,134,485 B2 | 3/2012 | Tamura |
| 8,248,030 B2 | 8/2012 | Doepke et al. |
| 8,461,825 B2 | 6/2013 | Biggadike |
| 8,742,762 B2 | 6/2014 | Henkel et al. |
| 8,779,725 B2 | 7/2014 | Knight |
| 9,766,293 B2 | 9/2017 | Sims et al. |
| 2008/0084182 A1 | 4/2008 | Oberlin et al. |
| 2009/0251103 A1 * | 10/2009 | Yamamoto ............... B60K 6/48 320/133 |
| 2010/0183904 A1 | 7/2010 | Muis |
| 2011/0001352 A1 * | 1/2011 | Tamura .................. B60L 58/15 307/9.1 |
| 2011/0043393 A1 * | 2/2011 | Tamura ................. H02J 7/0021 341/119 |
| 2011/0089899 A1 * | 4/2011 | Xu .................... H01M 10/4264 320/118 |
| 2012/0161677 A1 * | 6/2012 | Kunimitsu .......... H01M 2/1077 318/139 |
| 2012/0169129 A1 * | 7/2012 | Kim ................. H01M 10/0525 307/80 |
| 2012/0235483 A1 | 9/2012 | Rigby et al. |
| 2013/0101874 A1 | 4/2013 | Pevear |
| 2013/0245869 A1 * | 9/2013 | Nishida ................ B60L 3/0069 701/22 |
| 2015/0104681 A1 * | 4/2015 | Wang .................. H01M 10/482 429/50 |

FOREIGN PATENT DOCUMENTS

| | | |
|---|---|---|
| DE | 2012007575 | 10/2013 |
| EP | 1868839 | 12/2007 |
| EP | 2272722 | 1/2011 |
| JP | 2011015516 | 1/2011 |
| WO | 2009036444 A2 | 3/2009 |

* cited by examiner

INTEGRATED BATTERY SENSOR FOR MULTIPLE BATTERY MODULES

CROSS REFERENCE TO RELATED APPLICATIONS

This application claims priority from and the benefit of U.S. Provisional Application Ser. No. 61/978,510, entitled "INTEGRATED LITHIUM ION AND INTEGRATED BATTERY SENSOR FUNCTIONALITY FOR START-STOP VEHICLES", filed Apr. 11, 2014, which is hereby incorporated by reference.

BACKGROUND

The present disclosure generally relates to the field of batteries and battery modules. More specifically, the present disclosure relates to an integrated battery sensor for batteries and battery modules.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 volt or 130 volt systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator.

Further, a micro-hybrid electric vehicle (mHEV) also uses a "Stop-Start" system similar to the mild hybrids, but the micro-hybrid systems of an mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

To efficiently operate the vehicles, it may be useful for the battery-powered electrical systems in xEVs to monitor various aspects of batteries contained therein. That is, a vehicle control system may control the power operations of a vehicle more efficiently when it is aware of various properties associated with the batteries used by the vehicle. Accordingly, it may be useful to employ circuitry that monitors various properties of the batteries used by the vehicle.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, an automotive battery system may include a lead acid battery module that couples to an electrical system. The battery system may also include a lithium ion battery module coupled in parallel with the lead acid battery module. The lithium ion battery module may include a first terminal corresponds to a positive voltage, a second terminal and a third terminal corresponds to a first negative voltage, and a resistor coupled to the second terminal and the third terminal. The second terminal is coupled to a fourth terminal of the lead acid battery module, and the fourth terminal corresponds to a second negative voltage. The battery system may also include a control system that receives a voltage signal associated with the resistor, such that the voltage signal is associated with a voltage of the lead acid battery module In another embodiment, a method may include receiving, via a processor disposed within a lithium ion battery module, a voltage signal associated with a resistor coupled to a negative terminal of the lithium ion battery module. The negative terminal of the lithium ion battery module is coupled to a negative terminal of a lead acid battery module. The method also includes determining, via the processor, one or more properties associated with the lead acid battery module based on the voltage signal.

In yet another embodiment, a battery module for use in a vehicle. The battery module may include a housing, a first terminal, a second terminal, and a third terminal. The first terminal and the second terminal are associated with a same polarity. The battery module may also include a plurality of battery cells, a first resistor coupled to the plurality of battery cells and the first terminal, and a second resistor coupled to the first resistor and to the second terminal. The second terminal is configured to couple to a fourth terminal of a separate battery module. The battery module may also include a control system that may receive a first voltage signal associated with the first resistor and a second voltage signal associated with the second resistor. The control system may also determine a first set of properties associated with the separate battery module based on the second voltage signal.

DRAWINGS

Various aspects of this disclosure may be better understood upon reading the following detailed description and upon reference to the drawings in which.

DETAILED DESCRIPTION

Figure 1:
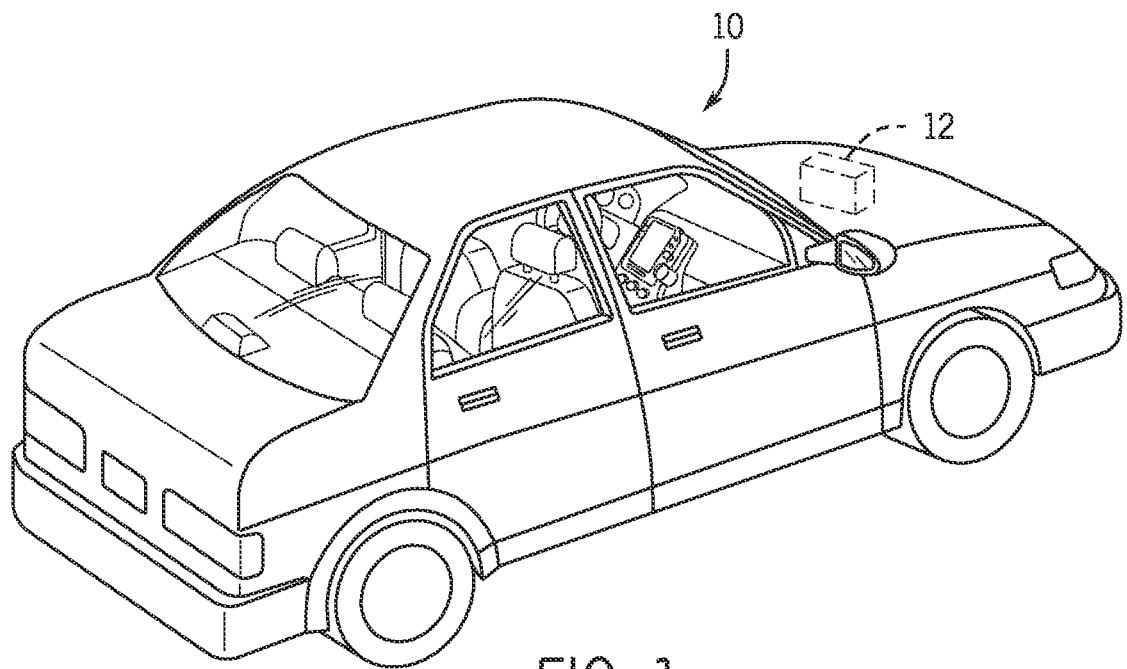
FIG. 1 is perspective view of a vehicle (e.g., an xEV) having a battery system contributing all or a portion of the power for the vehicle, in accordance with an embodiment presented herein.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure relates to batteries and battery modules. More specifically, the present disclosure relates to start-stop vehicles that may include circuitry or some sensing circuit connected in series to one of the battery posts that monitors a state of health (SOH), a state of charge (SOC), or various other properties associated with a battery employed in a start-stop vehicle.

Generally, a vehicle may include a battery system to provide motive force for the vehicle. As such, the battery system may include a number of battery modules, such as a lithium-ion battery module, a lead-acid battery module, and the like. In one embodiment, the lithium-ion battery module may include circuitry that monitors the SOH and SOC of each of a number of lithium ion cells of the lithium ion battery module, as well as a number of other properties related to the lithium ion battery module. In addition to monitoring the properties of the lithium ion battery module, the circuitry may also monitor various aspects of the lead acid battery module, which may be coupled in series with the lithium ion battery module at one terminal.

To effectively monitor the properties of a separate lead acid battery module using circuitry disposed within the lithium ion battery module, a lead acid battery sensor circuit may be integrated into the lithium ion circuitry to monitor the current, voltage, and temperature of the lead acid battery module. By integrating the lead acid battery sensor circuit into the lithium ion battery module, costs for manufacturing different sensing circuits for different battery modules may be minimized. Moreover, given the intricacies of the lithium ion battery module and the processing performed by the circuitry disposed on the lithium ion battery module, the data acquired by the lead acid battery sensor may be used by the circuitry of the lithium ion battery module to more effectively provide power to the vehicle based on the SOC and SOH of the lithium ion battery module and the lead acid battery module. Moreover, by including the lead acid battery sensor circuit into the lithium ion battery module, redundant circuits for the lithium ion battery module and the lead acid battery module may be avoided.

As discussed above, battery xEV vehicle systems may provide advantages over traditional gas-powered vehicle technology. Further, battery xEV technology has led to improvements in fuel economy and/or reductions in undesirable emissions compared to more traditional gas-powered vehicles. For example, regenerative braking vehicles capture and store electrical energy generated when the vehicle is braking or coasting. The captured electrical energy may then be utilized to supply power to the vehicle's electrical system. As another example, battery modules in accordance with present embodiments may be incorporated with or provide power to stationary power systems (e.g., non-automotive systems).

Based on the advantages over traditional gas-power vehicles, manufactures, which generally produce traditional gas-powered vehicles, may desire to utilize improved vehicle technologies (e.g., regenerative braking technology) within their vehicle lines. Often, these manufactures may utilize one of their traditional vehicle platforms as a starting point. Accordingly, since traditional gas-powered vehicles are designed to utilize 12-volt battery systems, a 12-volt lithium ion battery may be used to supplement a 12-volt lead-acid battery. More specifically, the 12-volt lithium ion battery may be used to more efficiently capture electrical energy generated during regenerative braking and subsequently supply electrical energy to power the vehicle's electrical system.

However, as advancements occur with vehicle technologies, high voltage electrical devices may be included in the vehicle's electrical system. For example, the lithium ion battery may supply electrical energy to an electric motor in a mild-hybrid vehicle. Often, these high voltage electrical devices utilize voltage greater than 12 volts, for example, up to 48 volts. Accordingly, in some embodiments, the output voltage of a 12-volt lithium ion battery may be boosted using a DC-DC converter to supply power to the high voltage devices. Additionally or alternatively, a 48-volt lithium ion battery may be used to supplement a 12-volt lead-acid battery. More specifically, the 48-volt lithium ion battery may be used to more efficiently capture electrical energy generated during regenerative braking and subsequently supply electrical energy to power the high voltage devices.

Thus, the design choice regarding whether to utilize a 12-volt lithium ion battery or a 48-volt lithium ion battery may depend directly on the electrical devices included in a particular vehicle. Nevertheless, although the voltage characteristics may differ, the operational principles of a 12-volt lithium ion battery and a 48-volt lithium ion battery are generally similar. More specifically, as described above, both may be used to capture electrical energy during regenerative braking and subsequently supply electrical energy to power electrical devices in the vehicle.

Accordingly, to simplify the following discussion, the present techniques will be described in relation to a battery system with a 12-volt lithium ion battery and a 12-volt lead-acid battery. However, one of ordinary skill in art should be able to adapt the present techniques to other battery systems, such as a battery system with a 48-volt lithium ion battery and a 12-volt lead-acid battery or any other suitable combination of batteries.

With the preceding in mind, the present disclosure describes systems and techniques for monitoring properties of the lead acid battery via circuitry disposed within the lithium ion battery. By way of introduction, FIG. 1 is a perspective view of an embodiment of a vehicle 10, which may utilize a regenerative braking system. Although the following discussion is presented in relation to vehicles with regenerative braking systems, the techniques described herein may be applied to other vehicles including xEV and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
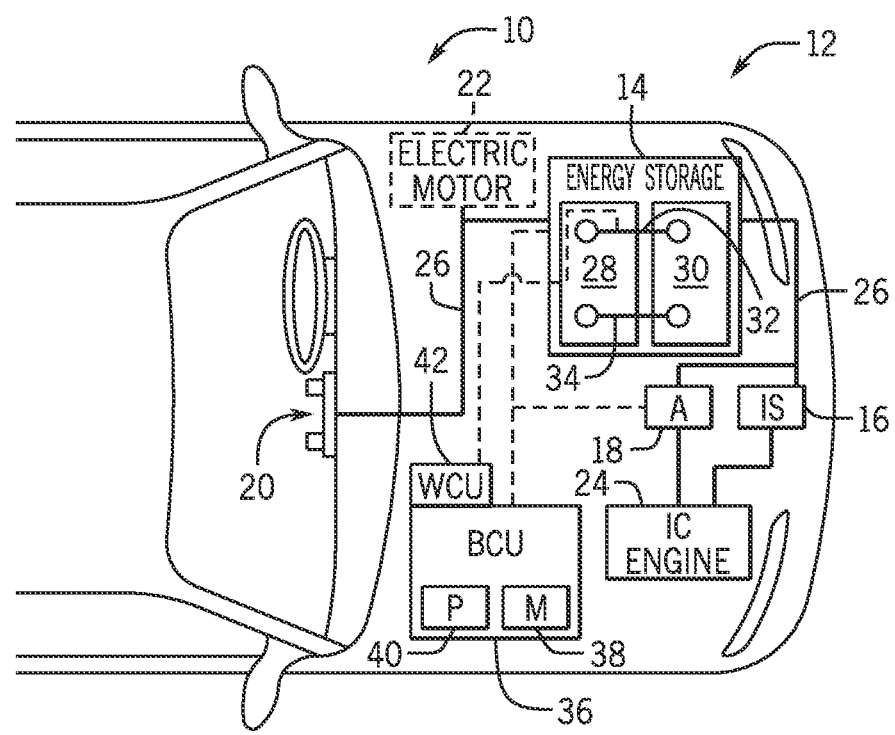
FIG. 2 is a cutaway schematic view of the vehicle of FIG. 1 in the form of a hybrid electric vehicle (HEV), in accordance with an embodiment presented herein.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

More specifically, the energy storage component 14 may capture/store generated electrical energy and output electrical energy to power each of these components, as well as others. In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, the energy storage component 14 depicted in FIG. 2 supplies power to the vehicle console 20 and the ignition system 16 to start (e.g., crank) the internal combustion engine 24. In some embodiments, the ignition system 16 may include a traditional starter and/or a belt starter generator (BSG).

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. In other words, the energy storage component 14 may capture electrical energy generated during regenerative braking.

To facilitate capturing and supplying electric energy, the energy storage component 14 may be coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20. Accordingly, when a 12-volt battery system 12 is used, the bus 26 may carry electrical power typically between 8-18 volts.

Additionally, the energy storage component 14 may include multiple battery modules. For example, in the depicted embodiment, the energy storage component 14 includes a lead acid battery module 28 and a lithium ion battery module 30, which each includes one or more battery cells. In other embodiments, the energy storage component 14 may include any number of battery modules. Additionally, although the lead acid battery module 28 and the lithium ion battery module 30 are depicted adjacent to one another, they may be positioned in different areas around the vehicle. For example, the lithium ion battery module 30 may be positioned in or about the interior of the vehicle 10 while the lead acid battery module 28 may be positioned under the hood of the vehicle 10.

By employing the lead acid battery module 28 with the lithium ion battery module 30, the performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

Figure 3:
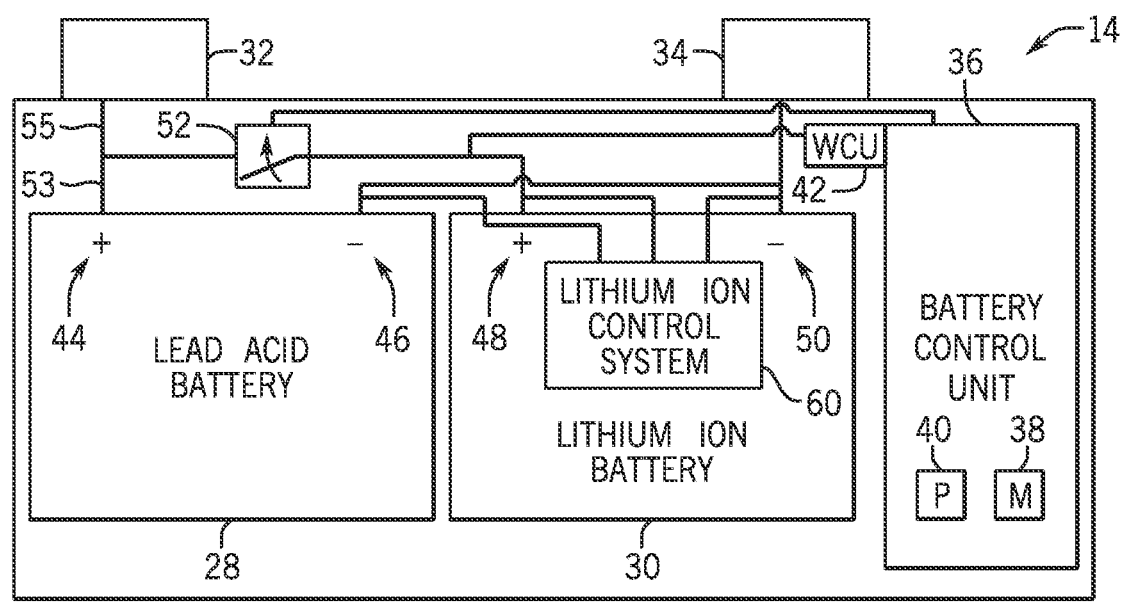
FIG. 3 is a schematic view of a battery system with a first battery, a second battery, and a battery control unit, in accordance with an embodiment presented herein.

To facilitate supply of power from the battery system 12 to the various components in the vehicle's electrical system (e.g., HVAC system and vehicle console 20), the energy storage component 14 includes a first terminal 32 and a second terminal 34. In some embodiments, the second terminal 34 may provide a ground connection and the first terminal 32 may provide a positive voltage ranging between 7-18 volts. A more detailed view of an embodiment of the energy storage component 14 represented as a battery module 14 is depicted in FIG. 3. As previously noted, the battery module 14 may have dimensions comparable to those of a typical lead-acid battery to limit modifications to the vehicle 10 design to accommodate the battery system 12. For example, the battery module 14 may be of similar dimensions to an H6 battery, which may be approximately 13.9 inches×6.8 inches×7.5 inches. As depicted, the battery module 14 may be included within a single continuous housing. In other embodiments, the battery module 14 may include multiple, housings coupled together (e.g., a first housing including the lead acid battery module 28 and a second housing including the lithium ion battery module 30). In still other embodiments, as mentioned above, the battery module 14 may include the lead acid battery module 28 located under the hood of the vehicle 10, and the lithium ion battery module 30 may be located within the interior of the vehicle 10.

As depicted, the battery module 14 includes the first terminal 32, the second terminal 34, the lead acid battery module 28, the lithium ion battery module 30, and a battery control unit 36. As used herein, the battery control unit 36 generally refers to control components that control operation of the battery system 12, such as relays within the battery module 14 or switches in the alternator 18. The operation of the battery module 14 may be controlled by the battery control unit 36. For example, the battery control unit 36 is configured to regulate an amount of electrical energy captured/supplied by each battery module 28 or 30 (e.g., to de-rate and re-rate the battery system 12), perform load balancing between the batteries, control charging and discharging of the batteries (e.g., via relays or DC/DC converters), determine a state of charge of each of the lead acid battery module 28 and the lithium ion battery module 30 and/or the entire battery module 14, activate an active-cooling mechanism, activate a short circuit protection system, and the like.

Accordingly, the battery control unit 36 may include one or more memory 38 and one or more processor 40 programmed to execute control algorithms for performing such tasks. More specifically, the one or more processor 40 may include one or more application specific integrated circuits (ASICs), one or more field programmable gate arrays (FPGAs), one or more general purpose processors, or any combination thereof. Additionally, the one or more memory 38 may include volatile memory, such as random access memory (RAM), and/or non-volatile memory, such as read-only memory (ROM), optical drives, hard disc drives, or solid-state drives. In some embodiments, the battery control unit 36 may include portions of a vehicle control unit (VCU) and/or a separate battery control module. Additionally, as depicted, the battery control unit 36 may be included separate from the battery module 14, such as a standalone module. In other embodiments, as depicted in FIG. 3, the battery control unit 36 may be included within the battery module 14.

Additionally, as depicted in FIG. 2, the lead acid battery module 28 and the lithium ion battery module 30 are connected in parallel across the first terminal 32 and the second terminal 34 to enable charging and discharging of the battery modules. As described above, the battery terminals 32 and 34 may output the power stored in the battery module 14 to provide power to the vehicle's electrical system. Further, the battery terminals 32 and 34 may also input power to the battery module 14 to enable the lead acid battery module 28 and the lithium ion battery module 30 to charge, for example, when the alternator 18 generates electrical power through regenerative braking.

Furthermore, the battery system 12 may include a wake-up control unit 42. As discussed in greater detail below, the wake-up control unit 42 may receive a voltage signal from the first terminal 32 during a vehicle hibernation mode, which may include a mode of the vehicle 10 while the vehicle 10 is in a key-off position. When the wake-up control unit 42 receives a signal indicating a potential short circuit condition of one or both of the batteries 28 and 30, the wake-up control unit 42 may provide a "wake-up" signal to the processor 40 of the battery control unit 36 to begin a short circuit detection and protection process. The short circuit detection and protection process may test the batteries 28 and 30 for a short circuit condition and protect the batteries 28 and 30 from the short circuit condition.

To provide more detail as to the battery module 14, FIG. 3 illustrates a schematic view of components of the battery module 14. As depicted, the lead acid battery module 28 and the lithium ion battery module 30 are separate within the battery module 14 which enables each to be configured based on desired characteristics, such as output voltage. For example, the output voltage of the lead acid battery module 28 and lithium ion battery module 30 may depend on the configuration of individual battery cells within each battery module (e.g., in serial or parallel) and the battery chemistries selected. Further, the configuration of battery cells and the battery chemistries selected may result in certain advantages specific to multiple battery chemistries and cell arrangements. For example, the advantages may include an increased range in charging voltages, or the advantages may include varied power and charging capacities within the battery module 14.

Additionally, as discussed above, the lead acid battery module 28 and the lithium ion battery module 30 may couple to the first terminal 32 and the second terminal 34 in a parallel manner. In other words, a positive terminal 44 of the lead acid battery module 28 may electrically couple to the first terminal 32 of the battery module 14, and a negative terminal 46 may electrically couple to the second terminal 34 of the battery module 14. In a similar manner, a positive terminal 48 of the lithium ion battery module 30 may electrically couple to the first terminal 32 of the battery module 14, and a negative terminal 50 of the lithium ion battery module 30 may electrically couple to the second terminal 34 of the battery module 14. In this manner, the two battery modules 28, 30 may electrically couple in parallel with each other to the bus 26 to provide power to various components of the electrical system of the vehicle 10.

Further, the wake-up control unit 42 may receive a voltage signal from the positive terminal 48, the positive terminal 44, or both to determine a possible short circuit condition of the second battery module 30, the first battery module 28, or both. Upon receiving a voltage signal from the first and/or second battery modules 28, 30, the wake-up control unit 42 may provide a signal to "wake-up" the battery control unit 36 while the vehicle is in a hibernating mode or a key-off mode. Upon verifying the presence of the short circuit condition, the battery control unit 36 may instruct a switch 52 to open. As used herein, a "switch" is intended to describe any mechanism that can selectively connect and disconnect the battery modules 28, 30, such as a hardware switch, a contactor, a relay, or a bi-stable relay.

Figure 4:
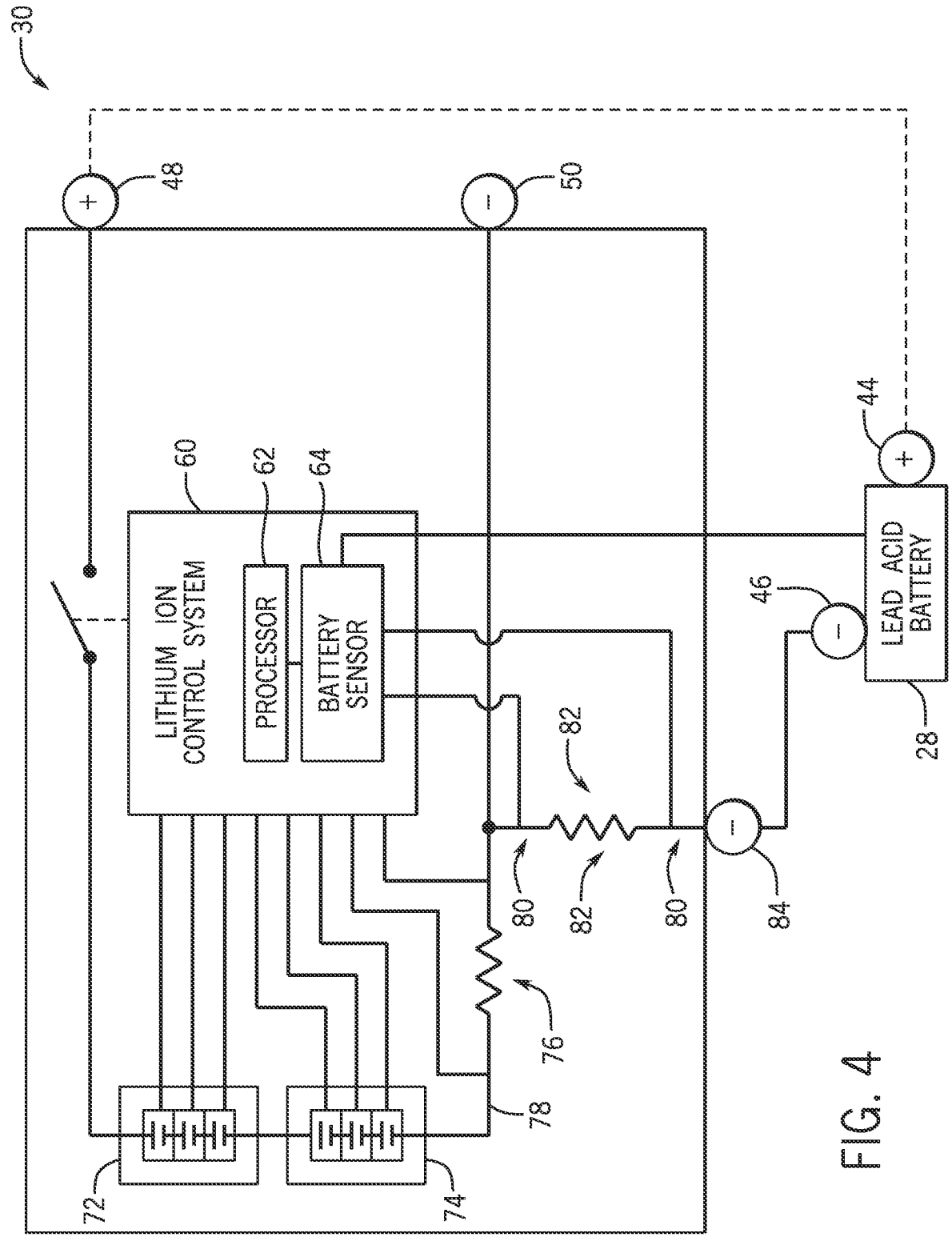
FIG. 4 is a schematic diagram of a lithium ion battery module of the battery system of FIG. 3, in accordance with an embodiment presented herein.

With the foregoing in mind, FIG. 4 is a schematic diagram of the lithium ion battery module 30. As shown in FIG. 4, the lithium ion battery module 30 may include the lithium ion control system 60. The lithium ion control system 60 may be disposed on a printed circuit board (PCB), which may monitor various properties regarding the lithium ion battery module 30. To monitor these properties, the lithium ion control system 60 may include a processor 62 and a battery sensor component 64. The processor 62 may include any type of processing device and may include multiple processors that may perform computer-executable instructions.

The processor 62 may receive data from one set or multiple sets of lithium ion cells that may provide a voltage to output by the lithium ion battery module 30. In the example provided in FIG. 4, the lithium ion battery module 30 may include two sets of lithium ion cells: upper lithium ion cells 72 and lower lithium ion cells 74. The upper lithium ion cells 72 are described as upper in view of its position over the lower lithium ion cells 74. In any case, both the upper lithium ion cells 72 and lower lithium ion cells 74 may correspond to lithium ion battery cells used to provide power to the vehicle 10. The data regarding the lithium ion battery cells 72 and 74 may include voltage measurements, temperature measurements, and the like. The processor 62 may also receive data associated with a voltage across a first shunt resistor 76, which is coupled in series with the lithium ion cells 72 and 74 along a negative bus 78 of the lithium ion battery module 30. The data may be used by the processor 62 to determine various properties regarding the lithium ion battery module 30 such as the state of charge (SOC) and the state of health (SOH) of the battery module 30. The SOC of the lithium ion battery module 30 may correspond to a percentage at which the lithium ion battery cells 72 and 74 are charged. The SOH of the lithium ion battery module 30 may correspond to a condition of the lithium ion battery cells 72 and 74 as compared to the condition of the cells at the time of manufacture. As such, various factors regarding how the lithium ion battery module 30 is used, the environment in which the lithium ion battery module 30 is used, and the like may be used to determine the SOH of the lithium ion battery module 30.

In addition to monitoring the properties of the lithium ion battery module 30, the lithium ion control system 60 may also monitor properties, such as current and voltage, associated with the lead acid battery module 28. To monitor these properties of the lead acid battery module 28, the lithium ion battery module 30 may include a shunt bus 80 coupled to the negative bus 78 of the lithium ion battery module 30. The shunt bus 80 may also include a second shunt resistor 82 that may be electrically coupled between the negative bus bar 78 and a second negative terminal 84.

In one embodiment, the battery sensor component 64 may receive a voltage signal associated with the voltage across the second shunt resistor 82. As shown in FIG. 4, the second shunt resistor 82 may be electrically coupled to the second negative terminal 84 of the lithium ion battery module 30. The second negative terminal 84 may also be electrically coupled to the negative terminal 46 of the lead acid battery module 28. As such, the voltage across the second shunt resistor 82 may correspond to a voltage across the lead acid battery module 28 and correspond to the current being conducted via the lead acid battery module 28. In one embodiment, the battery sensor component 64 may receive data associated with the voltage across the second shunt resistor 82 and forward the data to the processor 62. The processor 62 may then use the data along with a known value of the second shunt resistor 82 to determine the SOC, the SOH, and other properties associated with the lead acid battery module 28.

In addition to receiving the voltage data associated with the second shunt resistor 82, the battery sensor 64 may also receive a temperature measurement from a sensor disposed within the lead acid battery module 28. Using the temperature measurement, the processor 62 may update the SOC, the SOH, and other properties associated with the lead acid battery module 28 based on the additional information regarding the temperature of the lead acid battery module 28.

Figure 5:
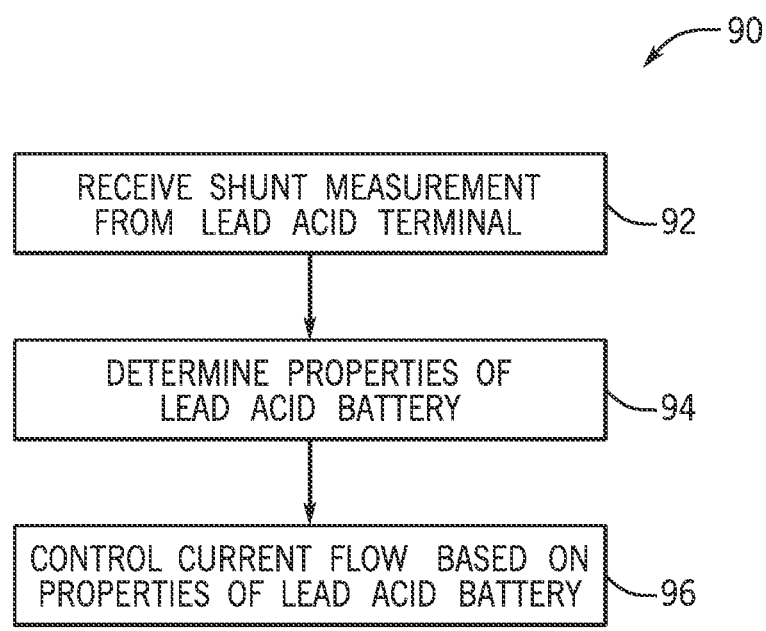
FIG. 5 is a flow chart describing a method for monitoring properties of a lead acid battery module via a lithium ion control system, in accordance with an embodiment presented herein.

With the foregoing in mind, FIG. 5 illustrates a flow chart of a method 90 that may be performed by the processor 62 in view of the lithium ion battery module 30 described above with reference to FIG. 4. Referring to FIG. 5, at block 92, the processor 62 may receive a measurement associated with the second shunt resistor 82. As discussed above with reference to FIG. 4, the second shunt resistor 82 may be electrically coupled to the negative bus of the lithium ion battery module 30 and a second negative terminal 84 of the lithium ion battery module 30.

The measurement associated with the second shunt resistor 82 may include a voltage drop across the second shunt resistor 82. The voltage drop generally corresponds to a current present on the shunt bus 80, which is electrically coupled to the negative terminal 46 of the lead acid battery module 20 via the second negative terminal 84 of the lithium ion battery module 30. As such, the voltage drop across the second shunt resistor 82 may correspond to a current conducting via the lead acid battery module 28.

In addition to the measurement associated with the second shunt resistor 82, the processor 62 may also receive a temperature measurement of the lead acid battery module 28. After receiving this data regarding the lead acid battery module 28, the processor 62 may, at block 94, determine properties regarding the lead acid battery module 28 based on the data. That is, the processor 62 may use the current conducting via the lead acid battery module 28, a voltage associated with the lead acid battery module 28, the temperature measurement associated with the lead acid battery module 28, and the like to determine various properties regarding the lead acid battery module 28. The properties may include the SOC, the SOH, and other relevant information regarding the lead acid battery module 28.

At block 96, the processor 62 may control various properties associated with the lithium ion battery module 30 based on the properties determined at block 94. For example, the processor 62 may control a current flow from the lithium ion battery module 30, a power output from the lithium ion battery module 30, or the like based on a power request from the vehicle 10.

One or more of the disclosed embodiments, alone or on combination, may provide one or more technical effects including eliminating a battery sensor circuit from the lead acid battery module 28. As such, instead of creating an additional printed circuit board to be disposed within the lead acid battery module 28, the printed circuit board of the lithium ion battery module 30 may effectively monitor certain characteristics of the lead acid battery module 28, thereby saving costs associated with manufacturing the lead acid battery module 28 and reducing the physical space used by the lead acid battery module 28. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. An automotive battery system, comprising:
a lead acid battery module configured to couple to an electrical system; and
a lithium ion battery module electrically coupled in parallel with the lead acid battery module, the lithium ion battery module comprising:
a first terminal corresponding to a positive voltage;
a second terminal and a third terminal corresponding to negative voltages, the second terminal being separate from the third terminal;
a resistor, the resistor being directly electrically coupled between the second terminal and the third terminal, and the second terminal being directly electrically coupled to a fourth terminal disposed on the lead acid battery module such that a voltage signal across the resistor is associated with a voltage of the lead acid battery module, the fourth terminal corresponding to a negative voltage; and
a control system, the control system being configured to:
receive the voltage signal associated with the resistor and associated with the voltage of the lead acid battery module; and
determine at least one of a state of charge (SOC) and a state of health (SOH) associated with the lead acid battery module based at least in part on the voltage signal.

2. The battery system of claim 1, wherein the lead acid battery module comprises a temperature sensor configured to measure an internal temperature of the lead acid battery module.

3. The battery system of claim 2, wherein the control system is configured to:
receive the internal temperature from the temperature sensor in the lead acid battery module; and
determine at least one of the SOC and the SOH associated with the lead acid battery module based at least in part on the internal temperature received from the lead acid battery module.

4. The battery system of claim 1, wherein the lithium ion battery module comprises a plurality of battery cells.

5. The battery system of claim 4, wherein the plurality of battery cells comprises at least two separate sets of battery cells electrically coupled in series with each other.

6. The battery system of claim 4, wherein the control system is configured to:
receive data associated with the plurality of battery cells; and
determine at least one of a state of charge (SOC) and a state of health (SOH) associated with the lithium ion battery module based on the data.

7. The battery system of claim 4, comprising an additional resistor electrically coupled between the plurality of battery cells and the third terminal.

8. The battery system of claim 1, wherein the lithium ion battery module comprises a chemistry having a higher coulombic efficiency than the lead acid battery module.

9. The battery system of claim 1, comprising a container that houses the lead acid battery module and the lithium ion battery module.

10. The battery system of claim 1, comprising a battery module that houses the lithium ion battery module and comprises a fifth terminal, wherein the third terminal is directly electrically coupled to the fifth terminal.

11. A method, comprising:
receiving, via a processor comprised in a lithium ion battery module, a voltage signal associated with a resistor in the lithium ion battery module, the resistor being directly electrically coupled to between a first negative terminal and a second negative terminal comprised in the lithium ion battery module, the second negative terminal of the lithium ion battery module being directly electrically coupled to a third negative terminal comprised in a lead acid battery module such that a voltage signal across the resistor is associated with a voltage of the lead acid battery module, the lead acid battery module being electrically coupled in parallel with the lithium ion battery module; and
determining, via the processor, at least one property associated with the lead acid battery module based at least in part on the voltage signal.

12. The method of claim 11, wherein the at least one property comprises a current being conducted through the lead acid battery module.

13. The method of claim 11, wherein the the at least one property comprises at least one of a state of charge (SOC) and a state of health (SOH) associated with the lead acid battery module.

14. The method of claim 11, comprising:
receiving, via the processor, a temperature measurement from a temperature sensor in the lead acid battery module; and
determining the the at least one property based at least in part on the temperature measurement.

15. A battery module for use in a vehicle, the battery module comprising:
a housing;
a first terminal, a second terminal, and a third terminal, the first terminal and the second terminal being associated with a same polarity;
a plurality of battery cells;
a first resistor electrically coupled to the plurality of battery cells and the first terminal;
a second resistor directly electrically coupled to the first resistor and directly electrically coupled between the first terminal and the second terminal, the second terminal being directly electrically coupled to a fourth terminal disposed on a separate battery module, the separate battery module being electrically coupled in parallel with the battery module; and
a control system configured to:
receive a first voltage signal associated with the first resistor and a second voltage signal, the second voltage signal being associated with the second resistor and associated with a voltage of the separate battery module; and
determine a first set of properties associated with the separate battery module based at least in part on the second voltage signal.

16. The battery module of claim 15, wherein the plurality of battery cells comprises a plurality of lithium ion cells.

17. The battery module of claim 15, wherein the separate battery module comprises a plurality of lead acid battery cells.

18. The battery module of claim 15, wherein the control system is configured to determine a second set of properties associated with the battery module.

19. The battery module of claim 15, wherein the control system is configured to receive a temperature measurement from a temperature sensor in the separate battery module and determine the first set of properties based at least in part on the temperature measurement.

\* \* \* \* \*

UNITED STATES PATENT AND TRADEMARK OFFICE
CERTIFICATE OF CORRECTION

PATENT NO. : 11,112,463 B2
APPLICATION NO. : 14/677529
DATED : September 7, 2021
INVENTOR(S) : Ronald J. Dulle It is certified that error appears in the above-identified patent and that said Letters Patent is hereby corrected as shown below:

In the Specification

Column 1, Line 41, delete "full hybrid systems (FHEVs)" and insert -- full hybrid electric vehicles (FHEVs) --, therefor.

Column 1, Line 44, delete "mild hybrid systems (MHEVs)" and insert -- mild hybrid electric vehicles (MHEVs) --, therefor.

Column 2, Line 52, delete "module" and insert -- module. --, therefor.

Column 3, Line 12, delete "DRAWINGS" and insert -- BRIEF DESCRIPTION OF DRAWINGS --, therefor.

Column 3, Line 17, delete "is" and insert -- is a --, therefor.

Column 7, Line 3, delete "multiple," and insert -- multiple --, therefor.

Column 7, Lines 44-45, delete "separate" and insert -- separately --, therefor.

Column 8, Line 12, delete "14" and insert -- 14, --, therefor.

Column 10, Lines 13-14, delete "lead acid battery module 20" and insert -- lead acid battery module 28 --, therefor.

Column 10, Line 39, delete "on" and insert -- in --, therefor.

In the Claims

Column 11, Line 49, Claim 3, delete "at" and insert -- the at --, therefor.

Signed and Sealed this
Ninth Day of November, 2021

Drew Hirshfeld
*Performing the Functions and Duties of the
Under Secretary of Commerce for Intellectual Property and
Director of the United States Patent and Trademark Office*

Column 12, Line 15, Claim 11, delete "coupled to" and insert -- coupled --, therefor.

Column 12, Line 31, Claim 13, delete "wherein the" and insert -- wherein --, therefor.

Column 12, Line 39, Claim 14, delete "determining the" and insert -- determining --, therefor.